United States Patent
Spingler et al.

(10) Patent No.: US 8,103,405 B2
(45) Date of Patent: Jan. 24, 2012

(54) OPERATOR CONTROL UNIT FOR DEVICES IN A MOTOR VEHICLE

(75) Inventors: Mark René Spingler, Elsdorf (DE); Erika Tsubaki, Köln (DE)

(73) Assignee: Ford Global Technologies, LLC, Dearborn, MI (US)

( * ) Notice: Subject to any disclaimer, the term of this patent is extended or adjusted under 35 U.S.C. 154(b) by 610 days.

(21) Appl. No.: 12/268,625

(22) Filed: Nov. 11, 2008

(65) Prior Publication Data

US 2009/0125195 A1    May 14, 2009

(30) Foreign Application Priority Data

Nov. 12, 2007  (DE) .................. 10 2007 053 774

(51) Int. Cl.
*B60R 16/02* (2006.01)
*B60R 11/00* (2006.01)
(52) U.S. Cl. .............. 701/36; 701/49; 296/37.8
(58) Field of Classification Search ............ None
See application file for complete search history.

(56) References Cited

U.S. PATENT DOCUMENTS

| | | | | |
|---|---|---|---|---|
| 4,308,439 A * | 12/1981 | Itoh | .................. | 200/511 |
| 6,028,537 A * | 2/2000 | Suman et al. | ............... | 340/988 |
| 6,125,030 A * | 9/2000 | Mola et al. | ............... | 361/679.56 |
| 6,608,399 B2 * | 8/2003 | McConnell et al. | ......... | 307/10.1 |
| 6,926,333 B2 * | 8/2005 | Sturt | .................... | 296/37.8 |
| 2006/0035502 A1 * | 2/2006 | Tiesler et al. | ............. | 439/340 |
| 2006/0144680 A1 | 7/2006 | Pelletier | | |
| 2010/0127525 A1 * | 5/2010 | Dassen | ................ | 296/37.7 |
| 2011/0199182 A1 * | 8/2011 | Catlin | .................. | 340/5.7 |

FOREIGN PATENT DOCUMENTS

| | | |
|---|---|---|
| DE | 20103004 | 7/2001 |
| DE | 10 326 400 | 12/2004 |
| DE | 10 2004 009 189 | 9/2005 |
| DE | 102009024386 A1 | 12/2010 |
| JP | 2004-224149 | * 8/2004 |
| JP | 2006-36022 | * 2/2006 |

* cited by examiner

*Primary Examiner* — Michael J. Zanelli
(74) *Attorney, Agent, or Firm* — Frank A. MacKenzie; Brooks Kushman P.C.

(57) ABSTRACT

An operator control unit for devices in a motor vehicle, having a carrier element and at least one operator control element arranged on the carrier element for generating an actuating signal for at least one device in the motor vehicle. The carrier element when in the installed state forms a storage space for holding objects to be stored in the passenger compartment of the motor vehicle.

9 Claims, 5 Drawing Sheets

OPERATOR CONTROL UNIT FOR DEVICES IN A MOTOR VEHICLE

CROSS-REFERENCE TO RELATED APPLICATION

This application claims foreign priority benefits under 35 U.S.C. §119(a)-(d) to DE 10 2007 053 774.5 filed Nov. 12, 2007, which is hereby incorporated by reference in its entirety.

BACKGROUND

1. Field

The present invention relates to an operator control unit for devices in a motor vehicle, for example for devices such as venting nozzles, passenger compartment lighting, opening and closing devices for windows, etc.

2. Background Art

For this purpose it is known in particular to accommodate comparatively flat control buttons in trim elements of the motor vehicle, wherein by activating these control buttons suitable actuating signals for a respectively assigned component or equipment element of the motor vehicle can be generated.

DE 10 2004 009 189 A1 discloses in this respect the use of a deformable carrier of an electronic circuit with a textile surface.

DE 103 26 400 A1 discloses an operator control element in a vehicle for activating an actuating device in which the operator control element has an operator control button which is embodied as a pressure-sensitive surface and by means of which an actuating signal can be generated as a function of the position and/or the intensity of a pressure which is applied to the operator control button, by means of which actuating signal the component to be adjusted can be correspondingly positioned by means of the actuating device.

DE 201 03 004 U1 discloses configuring a housing of electronic devices in such a way that the entire surface can be used as a display device and/or operator control surface. In this context, depending on requirements any desired parts of the surface, which may be composed, for example, of an LCD, a flat flexible film or a plasma film, can be activated for the purpose of displaying or performing operator control and the surface which can be activated can be controlled, changed or programmed by the user on an individual basis, for example by means of a software program.

The solutions discussed above permit the freedom of maneuver in terms of design when implementing operator control units to be increased. However, there is frequently a problem regarding space in the passenger compartment of modern motor vehicles since, despite the tendency of overall dimensions in the vehicle to increase, novel technologies and equipment features are being implemented and the activation elements which are necessary for this may require a considerable amount of space.

SUMMARY

Against the background described above, it is an object of the present invention to provide an operator control unit for devices in a motor vehicle by means of which improved utilization of the space in the passenger compartment of the motor vehicle is made possible.

An operator control unit according to the disclosed embodiment of the invention comprises a carrier element and at least one operator control element arranged on the carrier element for generating an actuating signal for at least one device in the motor vehicle. The carrier element is embodied in such a way that in the installed state it forms a storage space for holding objects to be stored in the passenger compartment of the motor vehicle.

Since the carrier element which is intended for holding the operator control elements forms, in the installed state, a storage space for holding objects to be stored, improved utilization of the space in the passenger compartment of the motor vehicle is made possible.

The carrier element is able to perform a double carrying function since it both serves as a carrier for one or more operator control elements and at the same time, when in an installed position (on the inner roof lining of the motor vehicle, for example), can support or hold the objects accommodated in the storage space which is made available.

According to one preferred embodiment, the carrier element is curved in the manner of a trough. As a result, as well as making available storage space by virtue of the trough-like embodiment, a curved and ergonomically advantageous shape of the operator control buttons which are assigned to the operator control elements can also be achieved.

The invention will be explained in more detail below on the basis of an exemplary embodiment illustrated in the appended drawings.

BRIEF DESCRIPTION OF THE DRAWINGS

Embodiments of the present invention described herein are recited with particularity in the appended claims. However, other features will become more apparent, and the embodiments may be best understood by referring to the following detailed description in conjunction with the accompanying drawings, in which:

DETAILED DESCRIPTION OF THE EMBODIMENT(S)

Figure 1:
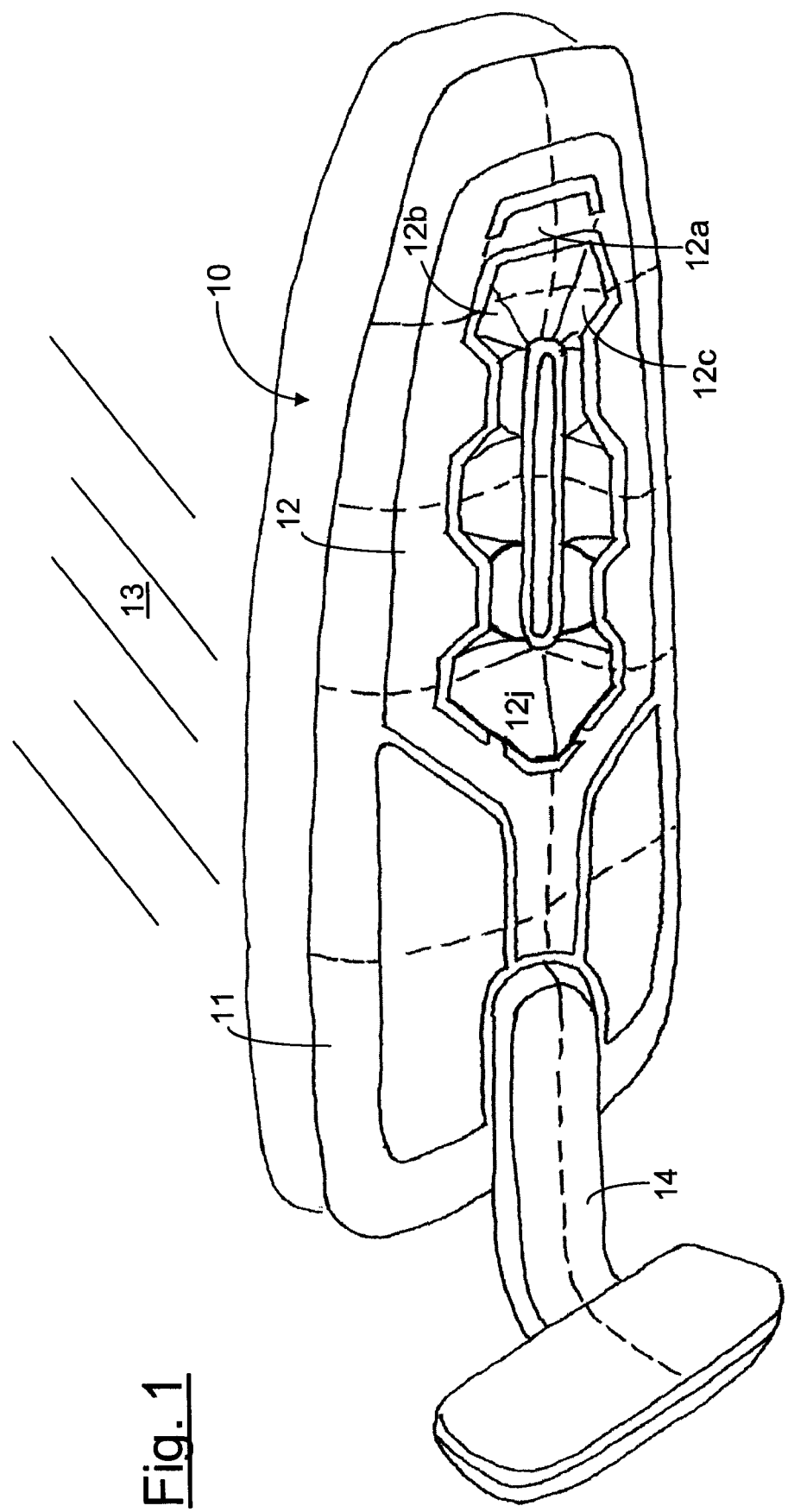
FIG. 1 is a schematic perspective view of an operator control unit according to one preferred embodiment of the invention.

FIG. 1 is a perspective illustration of an operator control unit 10 according to a preferred embodiment of the invention.

This operator control unit 10 has, in the exemplary embodiment, a carrier element 11 with a geometry which is curved in the manner of a trough and which is adapted for detachable mounting on the inner roof lining 13 of a motor vehicle. This detachable mounting can be implemented in any desired way, for example by means of plugging onto a securing strip (not illustrated) which is provided on the inner roof lining side or by means of some other plug-type connection. Furthermore, the wall which lies opposite the carrier element 11 on the inner roof lining side can be formed either by the passenger compartment trim which is provided on the inner roof lining 13 or else by a corresponding element which can be detachably secured to the carrier element 11 and to the inner roof lining 13. In the last-mentioned case, the operator control unit may be embodied, in particular, as a housing in which the carrier element forms a removable housing component which in the removed state clears the interior of the housing which serves as a storage space.

A component of the operator control unit 10 is also an elongated operator control button 12 which is provided on the carrier element 11 and has a plurality of planar operator control elements 12a, 12b, 12c, . . . which are each embodied in a pressure-sensitive or touch-sensitive manner as resistive film pressure sensors, referred to as FSR switching elements, so that by operating these operator control elements 12a, 12b, 12c, . . . , it is possible to generate actuating signals for, in each case, an assigned device which may be any desired component or equipment element of the motor vehicle.

Figure 3:
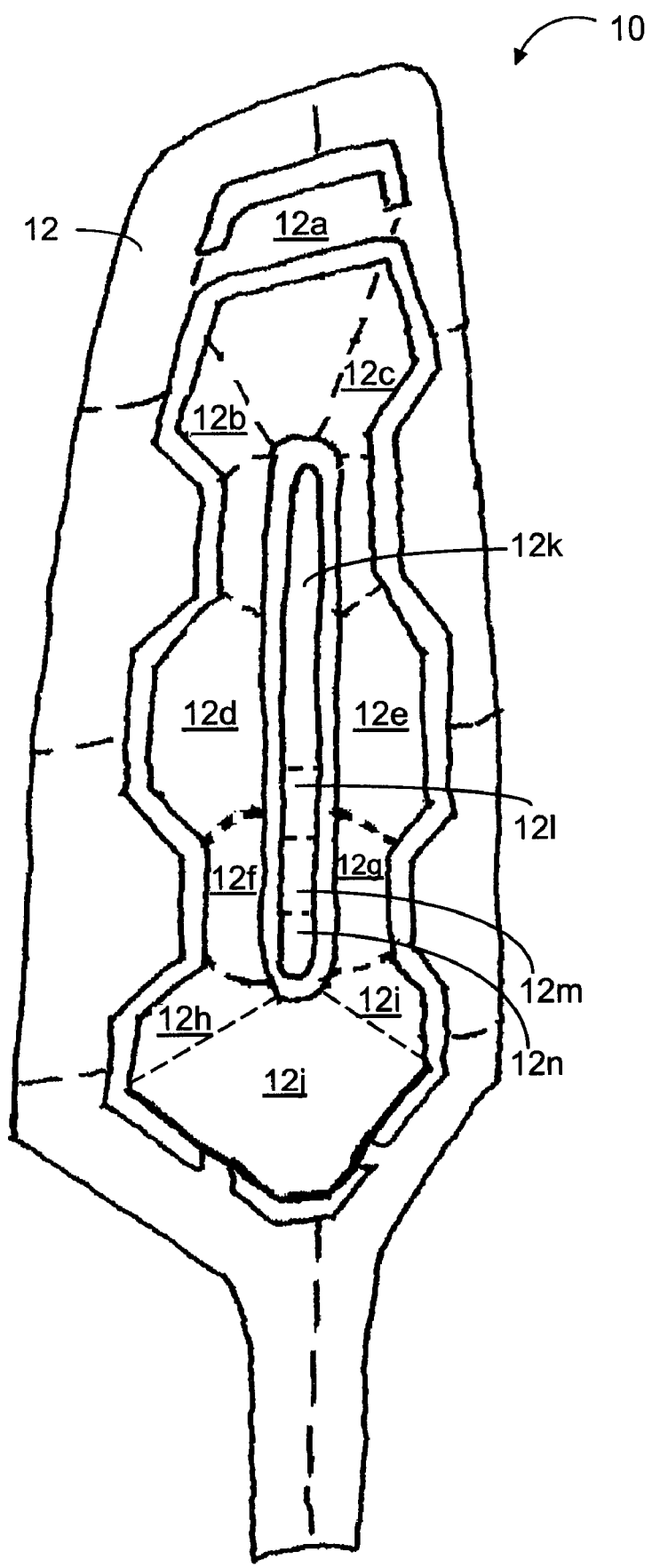
FIG. 3 shows an enlarged view of a detail of the operator control unit illustrated in FIG. 1.

In particular, the operator control elements which are provided according to the exemplary embodiment comprise, according to the arrangement illustrated in enlarged form in FIG. 3, an operator control element 12a for switching rear-mounted parking sensors on and off, operator control elements 12b-12c for venting nozzles, operator control elements 12d-12f for performing remote control of garage doors, an operator control element 12g for opening the engine hood, operator control elements 12h-12i for the left-hand and right-hand headlights, an operator control element 12j for lighting the passenger compartment, an operator control element 12k which has an elongated operator control panel and has the purpose of setting the opening width of a sunroof, an operator control element 12l for setting the tilt angle of the sunroof, an operator control element 12m for activating a rain sensor and an operator control element 12n for activating an electrical means of providing tinting or shade from ambient light, for example in a panorama sunroof.

In this context, in particular the operator control element 12k which is assigned to the sunroof and is equipped with the elongated operator control panel is embodied in such a way that it can be operated by moving along a finger in a way which is analogous to the direction of movement of the sunroof, as a result of which intuitive and therefore particularly convenient operator control is made possible. Analogous, intuitive operator control elements can also be implemented, for example, for actuating the window lifting devices. According to further embodiments, a scroll wheel can also be provided as an operator control element for, for example, setting the temperature of the air conditioning system, if appropriate in conjunction with a digital temperature display which is arranged, for example, on the operator control unit.

Figure 2:
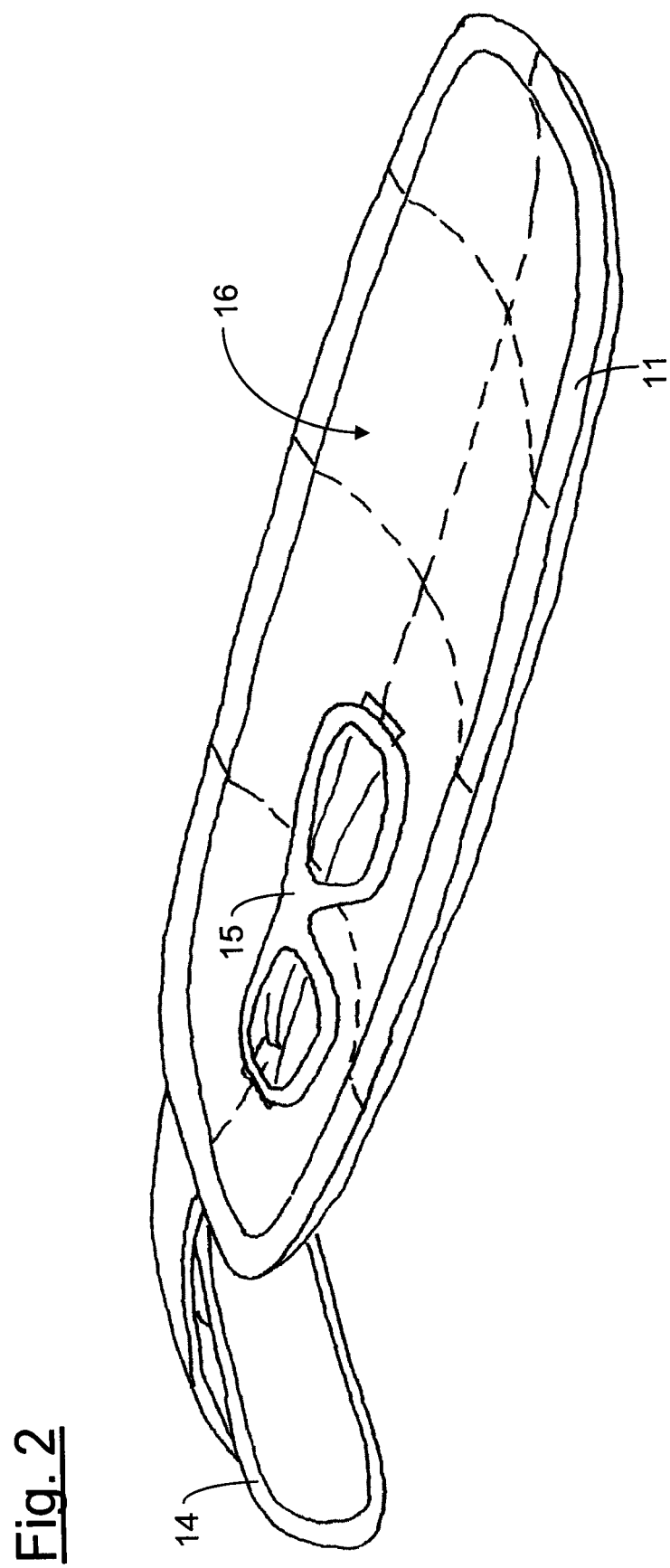
FIG. 2 is a perspective rear view of the operator control unit in FIG. 1 having an object which is held in a storage space made available by this operator control unit.

As is most clear from FIG. 2, the embodiment of the carrier element 11 which is curved in the manner of a trough has the result that in its installed position on the inner roof lining 13 the operator control element 10 forms a storage space 16 for any objects 15 which are to be stored, for example in FIG. 2 for sunglasses or else for documents (for example vehicle papers, roadmaps, etc.), wherein in particular in the longitudinal installation position, selected here, with respect to the direction of travel (which is indicated by the inclusion of the interior rear view mirror 14 in the drawing), the driver or front seat passenger can comfortably access the storage space 16 with one hand in order to store objects in the storage space 16 or remove them from it.

The carrier element 11 of the operator control unit 10 according to the invention has here a double carrying function in that, on the one hand, it serves as a carrier for the planar operator control elements 12a, 12b, 12c, . . . and, on the other hand, in the installed position on the inner roof lining 13 it supports the objects 15 accommodated in the storage space 16 which is made available. In this context, the configuration of the carrier element 11 which is curved in the manner of a trough results both in the provision of storage space which is brought about as a result of this and in an ergonomically advantageous shape of the operator control buttons which are assigned to the operator control elements 12a, 12b, 12c, . . . .

Figure 4:
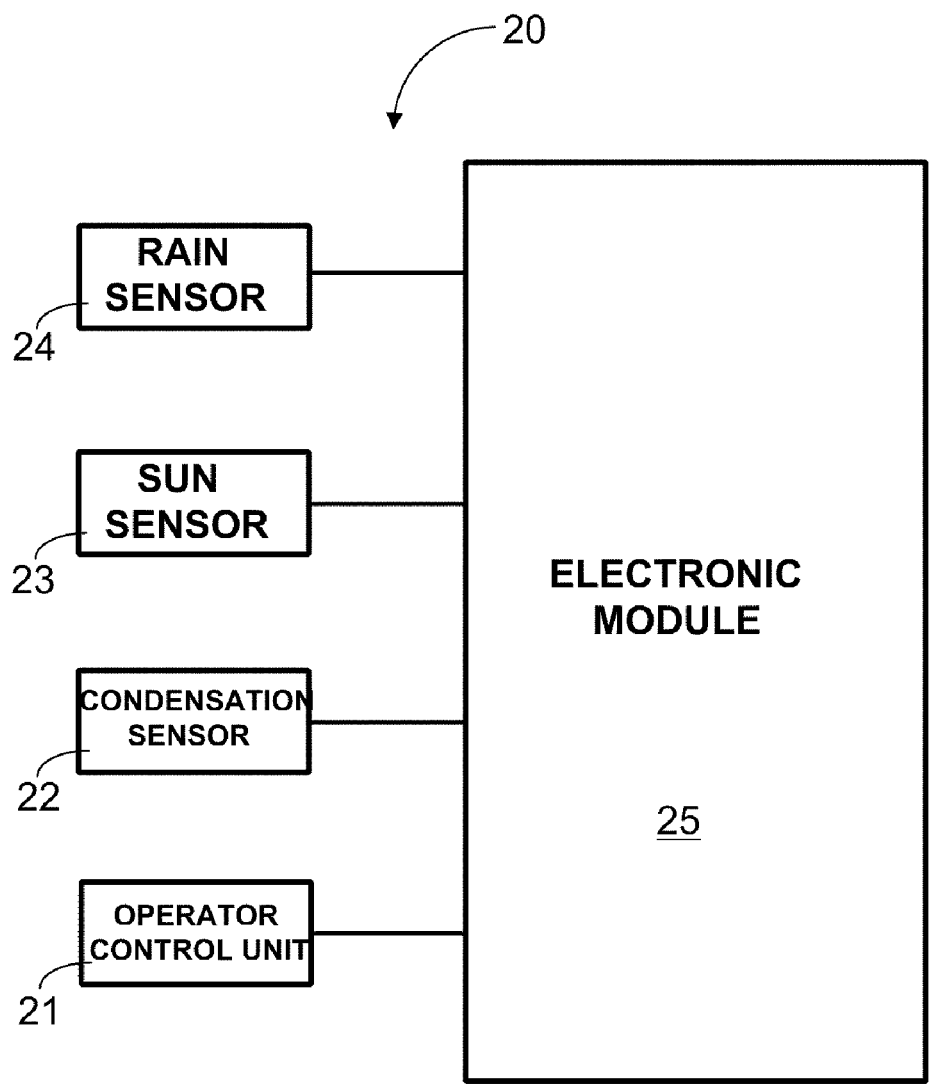
FIG. 4 shows a block circuit diagram explaining an electronic connection which is advantageously implemented in conjunction with the operator control unit according to the invention.

According to FIG. 4, a common electronic module 25 can serve for actuating and/or supplying power to both the operator control unit 21 according to the invention and further functional units (for example a condensation sensor 22 and a sun sensor 23 whose output signals are respectively used for climate control, and a rain sensor 24). In addition, the electronic module 25 can, for example, also serve for actuating or supplying power to the lighting of the passenger compartment or exterior lighting. All the functional units mentioned above can therefore use a common electronic infrastructure and a common communication system (for example a common printed circuit board and a common LIN node). Advantages which are achieved by means of the embodiment according to FIG. 4 are not only the saving in space which is achieved but also a saving in costs owing to a reduction in the necessary number of electronic components such as cables, plugs, etc. as well as also improved diagnostic capability.

Figure 5:
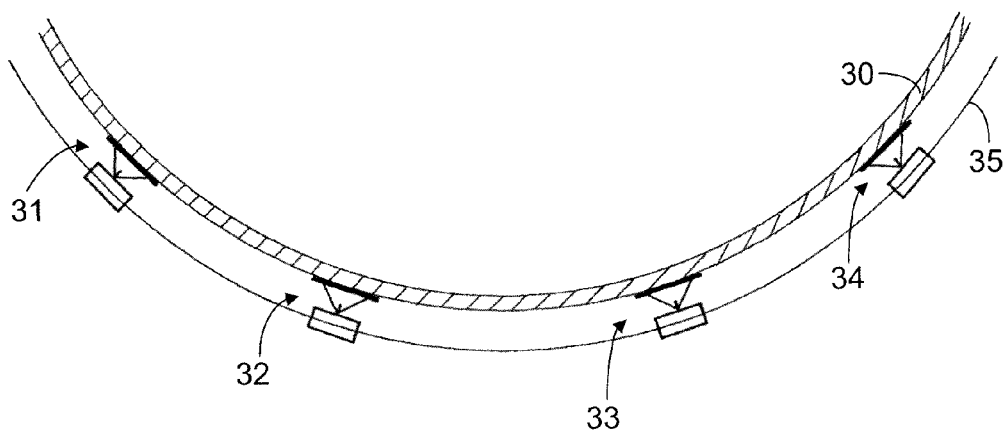
FIG. 5 is a schematic illustration explaining the design of an operator control unit according to one embodiment the invention.
Figure 6:
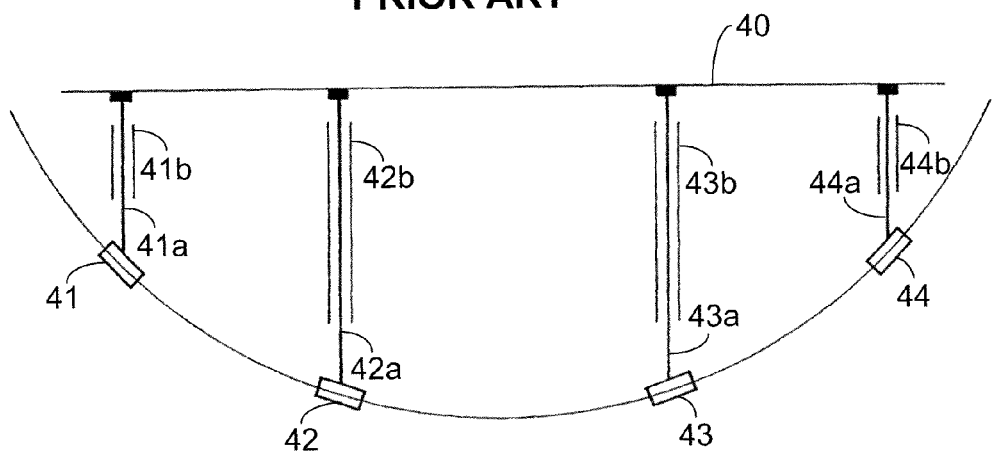
FIG. 6 is a schematic illustration explaining the design of an operator control unit which is implemented using conventional switches.

The schematic sectional view in FIG. 5 makes it clear how the provision of additional storage space is effected by the operator control unit 10 by particularly using the advantageous properties of the planar operator control elements 12a, 12b, 12c, . . . in the form of FSR switching elements. Here, for the purpose of comparison, FIG. 6 is a schematic illustration of an operator control unit with conventional switches 41, 42, 43 and 44 which transmit switching signals to a printed circuit board 40 via switching force transmission elements 41a, 42a, 43a, 44a and suitable guides 41b, 42b, 43b and 44b.

According to FIG. 5, the operator control unit according to the invention has resistive film pressure sensors or FSR switching elements 31-34 which change their electrical resistance in a manner known per se when mechanical pressure is applied in the normal direction, and can be activated with comparatively short switching paths (typically in the range of 0.3-0.5 mm). The film pressure sensors or FSR switching elements 31-34 are arranged on a substrate 30 which has the suitable geometry which is curved in the manner of a trough, and have, between the switching fields and the actual FSR switching segments of the FSR switching elements 31-34, mechanical coupling elements for making available a certain mechanical haptic impression.

While embodiments of the invention have been illustrated and described, it is not intended that these embodiments illustrate and describe all possible forms of the invention. Rather, the words used in the specification are words of description rather than limitation, and various changes may be made without departing from the spirit and scope of the invention.

What is claimed is:

1. An operator control unit for devices in a motor vehicle, the control unit embodied as a housing and comprising:
   a carrier element for installation in a passenger compartment of the motor vehicle to provide a storage space for holding objects to be stored in the passenger compartment; and
   at least one operator control element disposed on the carrier element and operative to generate an actuating signal for at least one device in the motor vehicle, wherein the carrier element forms a removable housing component which in a removed state clears the interior of the housing which serves as a storage space.

2. The operator control unit as claimed in claim 1, wherein the carrier element is curved such that the storage space is concave.

3. The operator control unit as claimed in claim 1, wherein the operator control unit is mountable on an inner roof lining of the motor vehicle.

4. The operator control unit as claimed in claim 1, wherein the carrier element is elongated.

5. The operator control unit as claimed in claim 1, wherein a plurality of operator control elements is formed on the carrier element.

6. The operator control unit as claimed in claim 1, wherein the at least one operator control element forms a pressure-sensitive or touch-sensitive surface region on the carrier element.

7. The operator control unit as claimed in claim 1, wherein the at least one operator control element is operable in a way which is analogous to at least one of a movement direction and a position of a component to be adjusted.

8. The operator control unit as claimed in claim 1, wherein the at least one operator control element is a resistive film pressure sensor.

9. The operator control unit as claimed in claim 1, wherein the at least one operator control element is a scroll wheel.

* * * * *